US011335273B2

(12) United States Patent
Choi et al.

(10) Patent No.: US 11,335,273 B2
(45) Date of Patent: May 17, 2022

(54) DISPLAY DEVICE CONTAINING INDIUM

(71) Applicant: Samsung Display Co., LTD., Yongin-si (KR)

(72) Inventors: Hye Lim Choi, Yongin-si (KR); Yeon Keon Moon, Hwaseong-si (KR); Joon Seok Park, Yongin-si (KR); Myoung Hwa Kim, Seoul (KR); Tae Sang Kim, Seoul (KR); Hyung Jun Kim, Seoul (KR); Geun Chui Park, Suwon-si (KR); Kyung Jin Jeon, Incheon (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/849,575

(22) Filed: Apr. 15, 2020

(65) Prior Publication Data

US 2020/0402467 A1    Dec. 24, 2020

(30) Foreign Application Priority Data

Jun. 19, 2019    (KR) ........................ 10-2019-0072739

(51) Int. Cl.
   *G09G 3/32*       (2016.01)
   *G09G 3/3291*     (2016.01)
   *H01L 27/32*      (2006.01)
   *G09G 3/3266*     (2016.01)

(52) U.S. Cl.
   CPC ......... *G09G 3/3291* (2013.01); *G09G 3/3266* (2013.01); *H01L 27/3272* (2013.01)

(58) Field of Classification Search
   CPC .. G09G 3/32; G09G 3/30; G09G 3/34; G09G 5/00; H01L 27/32; G06F 3/038
   See application file for complete search history.

(56) References Cited

U.S. PATENT DOCUMENTS

| 2014/0027759 | A1* | 1/2014  | Ahn ................... H01L 27/1225 257/43 |
| 2016/0351124 | A1* | 12/2016 | Kim ...................... G09G 3/3241 |
| 2016/0380064 | A1* | 12/2016 | Park .................. H01L 29/78669 257/72 |
| 2018/0013085 | A1* | 1/2018  | Shin ....................... H01L 51/50 |
| 2020/0006394 | A1* | 1/2020  | Sugawara ......... H01L 29/66765 |

(Continued)

FOREIGN PATENT DOCUMENTS

| KR | 10-2019-0001279 | 1/2019 |
| KR | 10-2020-0089794 | 7/2020 |

OTHER PUBLICATIONS

Rongsheng Chen et al., "Self-aligned top-gate InGaZnO thin film transistors using SiO2/Al2O3 stack gate dielectric", Thin Solid Films, 2013, pp. 572-575, vol. 548, Elsevier B.V.

*Primary Examiner* — Pegeman Karimi

(74) *Attorney, Agent, or Firm* — Kile Park Reed & Houtteman PLLC

(57) ABSTRACT

A display device includes pixels connected to scan lines and data lines intersecting the scan lines, wherein each of the pixels includes a light emitting element and a first transistor configured to control a driving current supplied to the light emitting element according to a data voltage applied from a respective data line of the data lines, the first transistor includes a first active layer including an oxide semiconductor containing indium (In), and a content of the indium in the oxide semiconductor of the first active layer is 70 at % or more.

20 Claims, 21 Drawing Sheets

(56) References Cited

U.S. PATENT DOCUMENTS

2020/0027938 A1\* 1/2020 Song .................. H01L 27/1251
2020/0234654 A1 7/2020 Kim et al.
2020/0380898 A1\* 12/2020 Jung ....................... G09G 3/20

\* cited by examiner

TR1_1 : 310_1, 330_1, 340_1, 350_1

DISPLAY DEVICE CONTAINING INDIUM

CROSS-REFERENCE TO RELATED APPLICATION

This application claims priority from Korean Patent Application No. 10-2019-0072739 under 35 U.S.C. § 119, filed on Jun. 19, 2019 in the Korean Intellectual Property Office, the entire contents of which are incorporated herein by reference.

BACKGROUND

1. Technical Field

The disclosure relates to a display device, and more particularly, to a display device including an oxide thin film transistor having an amount of indium (In) for increasing a driving voltage range of the oxide thin film transistor.

2. Description of the Related Art

The importance of display devices has steadily increased with the development of multimedia technology. Accordingly, various types of display devices such as an organic light emitting display (OLED), a liquid crystal display (LCD) and the like have been used.

A display device is a device for displaying an image, and includes a display panel, such as an organic light emitting display panel or a liquid crystal display panel. Among them, such a light emitting display panel may include a light emitting element. Examples of a light emitting diode (LED) may include an organic light emitting diode (OLED) using an organic material as a fluorescent material, and an inorganic light emitting diode using an inorganic material as a fluorescent material.

A display device among the types described above includes a respective display panel, a gate driving circuit, a data driving circuit and a timing controller. The display panel includes data lines, gate lines, and pixels formed at intersections of the data lines and the gate lines. Each of the pixels receives a data voltage from the data line when a gate signal is supplied to the gate line using a thin film transistor as a switching element. Each of the pixels emits light with a predetermined brightness according to the data voltage.

A display device capable of displaying an image with a high resolution of Ultra High Definition (UHD) has been introduced, and a display device capable of displaying an image with a high resolution of 8K Ultra High Definition (8K UHD) is in a development stage. UHD refers to a resolution of 3,840×2,160 pixels, and 8K UHD refers to a resolution of 7,680×4,320 pixels.

In the case of a high resolution display device, as the number of pixels increases, a driving current of each of the pixels may decrease. As a result, a driving voltage range of a driving transistor of each pixel may be reduced.

SUMMARY

Aspects of the disclosure provide a display device including a thin film transistor having an oxide semiconductor active layer containing a specific amount of indium (In).

However, aspects of the present may not be restricted to the ones set forth herein. The above and other aspects of the disclosure will become more apparent to one of ordinary skill in the art to which the disclosure pertains by referencing the detailed description below.

A display device according to an embodiment may include a driving transistor including an active layer that may be formed of an oxide semiconductor containing a relatively high amount of indium (In). In a case that the active layer of the transistor may be an oxide semiconductor containing a relatively high amount of indium (In), as a driving voltage range may be widened or increased, the driving transistor may have excellent performance in supplying driving current.

Thus, as the area per unit pixel decreases, the driving transistor may have excellent operational characteristics even if the driving transistor includes a channel region having a narrow length.

According to an embodiment, a display device may include pixels connected to scan lines and data lines intersecting the scan lines, wherein each of the pixels includes a light emitting element and a first transistor configured to control a driving current supplied to the light emitting element according to a data voltage applied from a respective data line of the data lines, the first transistor includes a first active layer including an oxide semiconductor containing indium (In), and a content of the indium in the oxide semiconductor of the first active layer is 70 at % or more.

An amount of the indium (In) may be greater than or equal to about 70 at %.

The oxide semiconductor may contain indium-tin oxide (ITO) or indium-tin-gallium oxide (ITGO).

A sum of an amount of indium (In) and an amount of tin (Sn) in the oxide semiconductor may be greater than or equal to about 95 at %.

The amount of tin in the oxide semiconductor may be in the range of about 5% to about 20%.

The first active layer may include a first region, and a second region having a higher concentration of oxygen atoms than that of the first region.

The second region may be located on an upper surface of the first active layer and at least one side surface of the first active layer.

The first active layer may include a first conductor region, a second conductor region and a channel region disposed between the first conductor region and the second conductor region.

The first transistor may further include a first light shielding layer disposed below the first active layer; a first gate electrode disposed on the first active layer; a first source electrode in contact with the first conductor region through a first contact hole passing through a first insulating layer disposed on the first gate electrode; and a first drain electrode in contact with the second conductor region through a second contact hole passing through the first insulating layer.

The first gate electrode may overlap the first active layer in an overlapping amount of about 2 µm to about 10 µm.

The first source electrode may be in contact with the first light shielding layer through a third contact hole passing through the first insulating layer and a buffer layer disposed between the first active layer and the first light shielding layer.

A respective pixel of the pixels may include a second transistor configured to apply the data voltage of the data line of the data lines to the first transistor according to a scan signal applied to a respective scan line of the scan lines that may be connected with the second transistor, and the second transistor may include a second active layer including an oxide semiconductor including indium (In).

The second transistor may further include a second light shielding layer disposed below the second active layer; and a second gate electrode disposed on the second active layer.

The second gate electrode may be in contact with the second light shielding layer through a sixth contact hole passing through a first gate insulating layer disposed between the second active layer and the second gate electrode and a buffer layer disposed between the second active layer and the second light shielding layer.

The display device may further comprise a scan driver configured to output a scan signal to a respective scan line of the scan lines, wherein the scan driver may include a third transistor including a third active layer.

The first active layer of the first transistor may be disposed above the third active layer of the third transistor.

According to another embodiment, a display device may include pixels connected to scan lines and data lines intersecting the scan lines, wherein each of the pixels may include a light emitting element, a driving transistor configured to control a driving current supplied to the light emitting element according to a data voltage applied from a respective data line of the data lines, and a switching transistor configured to apply the data voltage of the respective data line to the driving transistor according to a scan signal applied to a respective scan line of the scan lines, the driving transistor and the switching transistor may include an active layer including an oxide semiconductor containing indium (In), and a content of the indium in the oxide semiconductor of the first active layer may be 70 at % or more.

An amount of the indium (In) may be greater than or equal to about 70 at %.

The oxide semiconductor may contain indium-tin oxide (ITO) or indium-tin-gallium oxide (ITGO).

A sum of an amount of indium (In) and an amount of tin (Sn) in the oxide semiconductor may be greater than or equal to about 95 at %.

An oxygen atom concentration of an upper surface of the active layer of the driving transistor may be higher than an oxygen atom concentration of a lower surface thereof.

The driving transistor may further include a gate electrode disposed on the active layer, and an overlapping region of the gate electrode and the active layer may have a length in a range of about 2 μm to about 10 μm.

BRIEF DESCRIPTION OF THE DRAWINGS

The above and other aspects and features of the disclosure will become more apparent by describing in detail embodiments thereof with reference to the accompanying drawings, in which.

DETAILED DESCRIPTION OF THE EMBODIMENTS

Figure 1:
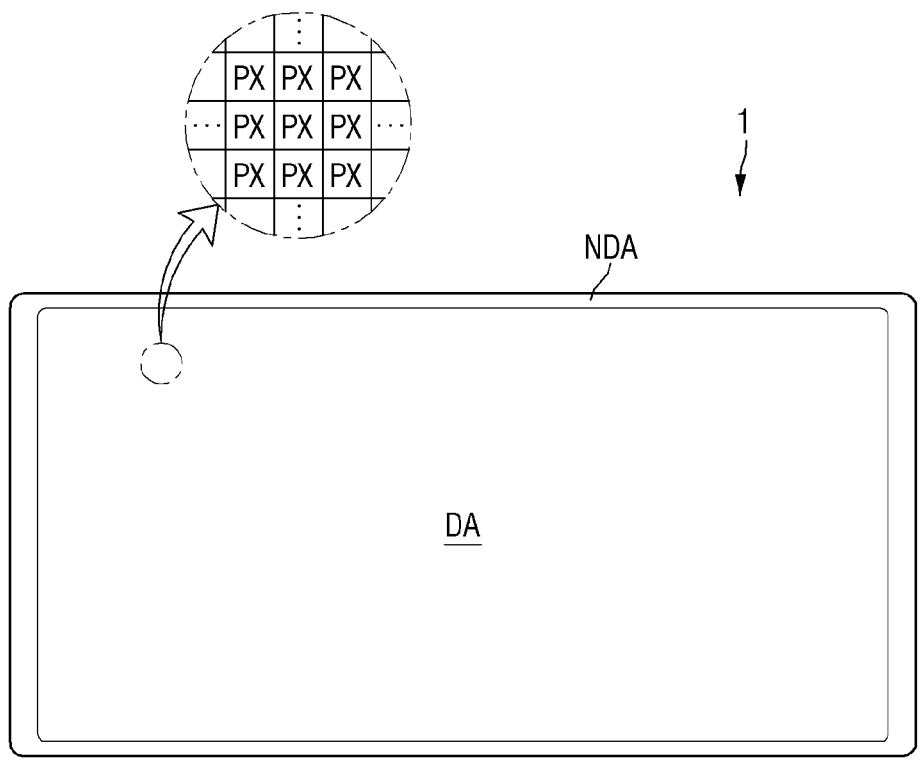
FIG. 1 illustrates a perspective view showing a display device according to an embodiment.

Although the disclosure may be modified in various manners and have additional embodiments, embodiments are illustrated in the accompanying drawings and will be mainly described in the specification. However, the scope of the disclosure is not limited to the embodiments in the accompanying drawings and the specification and should be construed as including all the changes, equivalents and substitutions included in the spirit and scope of the disclosure.

The drawings and description are to be regarded as only illustrative in nature, and thus are not limiting of embodiments described and claimed herein. Some of the parts which are not associated with the description may not be provided in order to describe embodiments of the disclosure and like reference numerals refer to like elements throughout the specification.

In the drawings, a size and thickness of each element are arbitrarily represented for better understanding and ease of description, however the disclosure is not limited thereto. In the drawings, the thickness of layers, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other. When a layer, region, substrate, or area, is referred to as being "on" another layer, region, substrate, or area, it may be directly on the other region, substrate, or area,, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
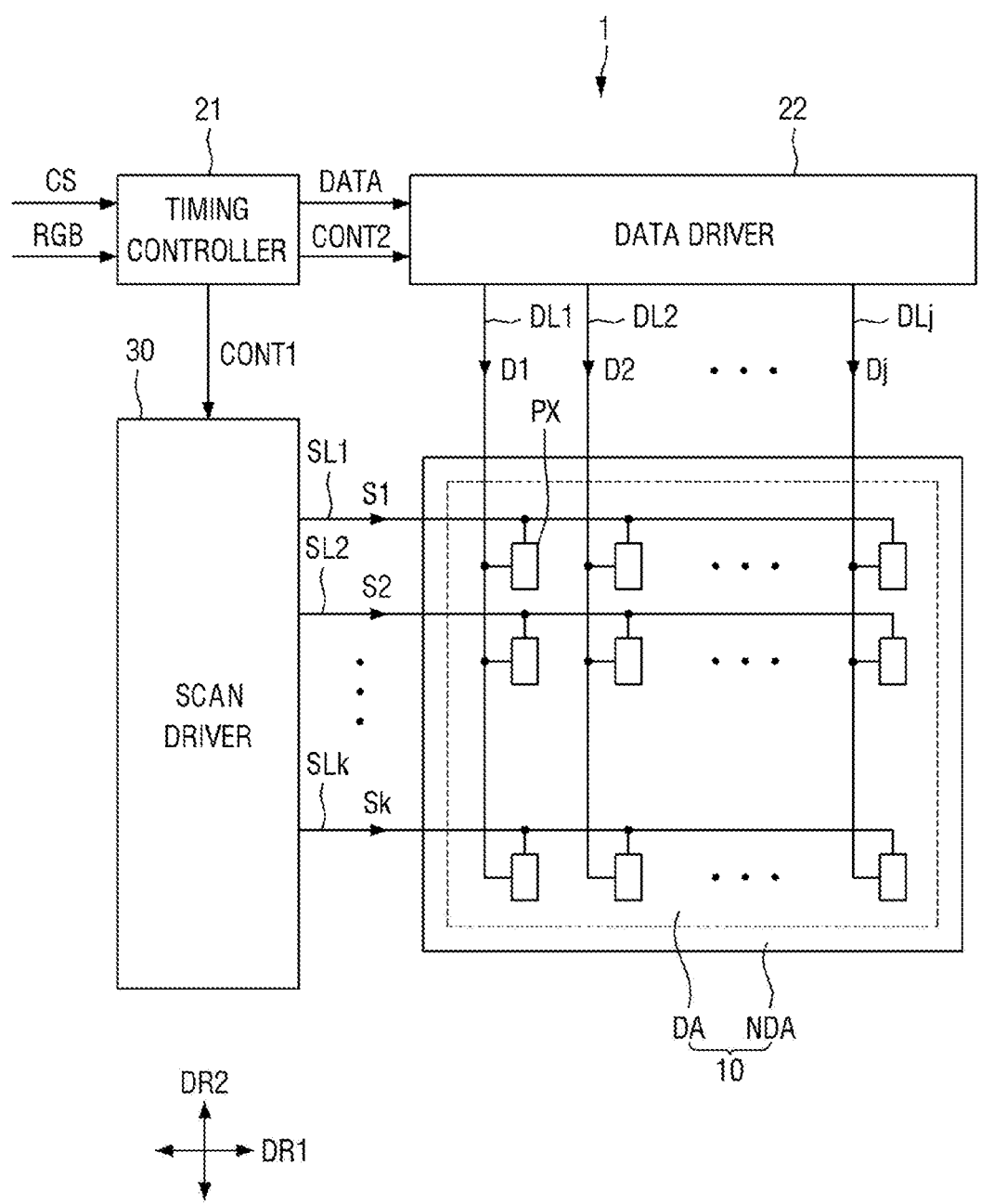
FIG. 2 illustrates a block diagram schematically showing a display device according to an embodiment.

FIG. 1 illustrates a perspective view showing a display device according to an embodiment. FIG. 2 illustrates a block diagram schematically showing a display device according to an embodiment.

Referring to FIGS. 1 and 2, a display device 1 displays a moving image or a still image. The display device 1 may be any electronic device providing a display screen. Examples of the display device 1 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, and a camcorder, which provide a display screen.

The display device 1 may include a display panel which provides the display screen. Examples of the display panel may include a LED display panel, an organic light emitting display panel, a quantum dot light emitting display panel, a plasma display panel and a field emission display panel. In the following description, the display device 1 may include a LED display panel. However, the disclosure is not limited thereto, and other types of display panels may be used.

The shape of the display device 1 may be variously modified. For example, the display device 1 may have a shape such as a rectangular shape elongated in a horizontal direction, a rectangular shape elongated in a vertical direction, a square shape, a rectangular shape with rounded corners (e.g., vertices), other polygonal shapes and a circular shape. The shape of a display area DA of the display device 1 may also be similar to the overall shape of the display device 1. In FIG. 1, the display device 1 may include the display area DA having a rectangular shape elongated in the horizontal direction.

The display device 1 may include the display area DA and a non-display area NDA. The display area DA may be an area where a screen may be displayed, and the non-display area NDA may be an area where a screen may not be displayed. The display area DA may also be referred to as an active region, and the non-display area NDA may also be referred to as a non-active region.

The display area DA may substantially occupy the center of the display device 1. The display area DA may include pixels PX. The pixels PX may be arranged in a matrix. The shape of each pixel PX may be a rectangular or square shape in plan view. However, the disclosure is not limited thereto, and the shape may be a rhombic shape in which each side is inclined with respect to a first direction DR1.

The display device 1 according to an embodiment includes a display panel 10, integrated driving circuits 21 and 22 and a scan driver 30. The integrated driving circuits 21 and 22 may respectively define a timing controller 21 and a data driver 22.

The display panel 10 may include a display area DA where pixels PX are formed to display an image and a non-display area NDA which is a peripheral area of the display area DA. In a case that the display panel 10 may include a curved surface portion, the display area DA may be disposed on the curved surface portion. The image of the display panel 10 may also be seen on the curved surface portion.

The pixels PX, scan lines SL1 to SLk (k is an integer of 2 or more), data lines DL1 to DLj (j is an integer of 2 or more) and power supply lines, which are connected to the pixels PX, may be disposed in the display area DA. The scan lines SL may be formed in parallel in the first direction DR1, and the data lines DL may be formed in parallel in a second direction DR2 which intersects the first direction DR1. Each of the pixels PX may be connected to at least one of the scan lines SL and one of the data lines DL.

Each of the pixels may include a driving transistor, at least one switching transistor, a light emitting element and a capacitor. Since the switching transistor may be turned on when a scan signal may be applied by the scan line SL, a data voltage of the data line DL may be applied to a gate electrode of the driving transistor. The driving transistor may emit light by supplying a driving current to the light emitting element according to the data voltage applied to the gate electrode. The driving transistor and the at least one switching transistor may be thin film transistors. The light emitting element may emit light according to the driving current of the driving transistor. The light emitting element may be an organic light emitting diode including a first electrode, an organic light emitting layer and a second electrode. The capacitor may keep the data voltage applied to the gate electrode of the driving transistor constant.

The non-display area NDA may be defined as an area from the outside of the display area DA to the edges of the display panel 10. The scan driver 30 and the integrated driving circuits 21 and 22 for applying scan signals to the scan lines SL may be disposed in the non-display area NDA.

The integrated driving circuits 21 and 22 may output signals and voltages for driving the display panel 10. To do so, the integrated driving circuits 21 and 22 may define the timing controller 21 and the data driver 22.

The timing controller 21 may receive digital video data and timing signals from a host system (not shown). The timing signals may include a vertical sync signal, a horizontal sync signal, a data enable signal and a dot clock. The host system may be an application processor of a smartphone or tablet PC, a monitor or a system on chip of a TV, or the like.

The timing controller 21 may generate control signals CS for controlling the operation timings of the data driver 22 and the scan driver 30. The control signals CS may include a source control signal CONT2 for controlling the operation timing of the data driver 22 and a scan control signal CONT1 for controlling the operation timing of the scan driver 30.

The data driver 22 may receive the digital video data and the source control signal CONT2 from the timing controller 21. The data driver 22 may convert the digital video data into analog data voltages according to the source control signal CONT2 and may supply the analog data voltages to the data lines DL1 to DLj of the display panel 10.

The integrated driving circuits 21 and 22 may be disposed in the non-display area NDA and may be provided on one side of the display panel 10. The integrated driving circuits 21 and 22 may be formed as a single integrated circuit (IC) and may be mounted on the display panel 10 by using a chip on glass (COG) method, a chip on plastic (COP) method, or an ultrasonic bonding method. However, the disclosure may not be limited thereto. For example, the integrated driving circuits 21 and 22 may be mounted on a circuit board other than the display panel 10.

Further, FIG. 2 illustrates that the integrated driving circuits 21 and 22 include the data driver 22 and the timing controller 21, but the disclosure may not be limited thereto. For example, the data driver 22 and the timing controller 21 may be formed as separate integrated circuits instead of being formed as one integrated circuit, as described above. Thus, the timing controller 21 may be mounted on the circuit board, and the data driver 22 may be mounted on the display panel 10 by using a chip on glass (COG) method, a chip on plastic (COP) method, or an ultrasonic bonding method.

The scan driver 30 may receive the scan control signal CONT1 from the timing controller 21. The scan driver 30 may generate scan signals according to the scan control signal CONT1 and may supply the scan signals to the scan lines SL1 to SLk of the display panel 10. The scan driver 30 may include multiple transistors and may be formed in the non-display area NDA of the display panel 10. The scan driver 30 may be formed as an integrated circuit, and may be mounted on a gate flexible film attached to the other side of the display panel 10.

Although not shown, the circuit board may be attached to pads provided on one edge of the display panel 10 using an anisotropic conductive film. Accordingly, the lead lines of the circuit board may be electrically connected to the pads. The circuit board may be a flexible film, such as a flexible printed circuit board, a printed circuit board, or a chip on film. The circuit board may be bent to the lower side of the display panel 10. One side of the circuit board may be attached to one edge of the display panel 10, and the other side of the circuit board may be disposed below the display panel 10 and connected to a system board on which the host system may be mounted.

A power supply circuit may generate voltages required for driving the display panel 10 from a main power source of the system board and may supply the voltages to the display panel 10. For example, the power supply circuit may generate a first power supply voltage and a second power supply voltage from the main power source for driving light emitting elements EL of the display panel 10 and may supply them to a first voltage line VDD (see FIG. 3) and a second voltage line VSS (see FIG. 3) of the display panel 10. Further, the power supply circuit may generate driving voltages from the main power source for driving the integrated driving circuits 21 and 22 and the scan driver 30 and supply them.

The power supply circuit may be formed as an integrated circuit and may be mounted on a circuit board, though the disclosure may not be limited thereto. For example, the power supply circuit may be formed integrally with the integrated driving circuits 21 and 22.

Figure 3:
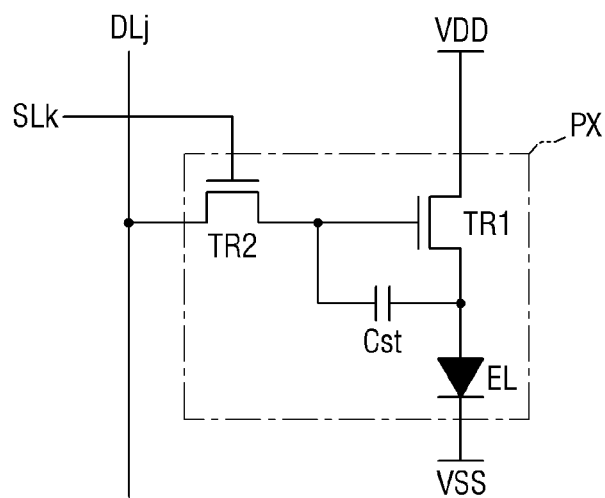
FIG. 3 illustrates a schematic diagram of an equivalent circuit of a pixel of FIG. 2 according to an embodiment.

FIG. 3 illustrates a schematic diagram of an equivalent circuit of a pixel of FIG. 2 according to an embodiment.

Referring to FIG. 3, the pixel PX may include a first transistor TR1, a second transistor TR2, a light emitting element EL and a capacitor Cst. Although FIG. 3 illustrates that each pixel PX may have a 2T1C (2Transistor-1Capacitor) configuration having one first transistor TR1, one second transistor TR2 and one capacitor Cst, the disclosure may not be limited thereto. For example, each pixel PX may include a greater number of transistors and multiple capacitors.

Each of the first and second transistors TR1 and TR2 may include a first electrode, a second electrode and a gate electrode. One of the first electrode and the second electrode may be a source electrode and the other one may be a drain electrode.

Each of the first and second transistors TR1 and TR2 may be formed as a thin film transistor. Further, although it may be seen from FIG. 3 that each of the first and second transistors TR1 and TR2 may be formed of an N-type Metal Oxide Semiconductor Field Effect Transistor (MOSFET), the disclosure may not be limited thereto. For example, each of the first transistor TR1 and the second transistor TR2 may be formed as a P-type MOSFET. Thus, the positions of the source electrode and the drain electrode of each of the first transistor TR1 and the second transistor TR2 may be changed. Herein, the first and second transistors TR1 and TR2 may be N-type MOSFETs with respect to the following discussion.

The first transistor TR1 may emit light by supplying a driving current to the light emitting element EL according to the data voltage applied to the gate electrode. For example, the first transistor TR1 may be a driving transistor. The gate electrode of the first transistor TR1 may be connected to the source electrode of the second transistor TR2, the source electrode of the first transistor TR1 may be connected to the first electrode of the light emitting element EL, and the drain electrode of the first transistor TR1 may be connected to the first voltage line VDD to which the first power supply voltage is applied.

Since the second transistor TR2 may be turned on when a scan signal may be applied from the k-th scan line SLk (where k is a positive integer), a data voltage of the data line DLj may be applied to the gate electrode of the first transistor TR1. For example, the second transistor TR2 may be a switching transistor. The gate electrode of the second transistor TR2 may be connected to the k-th scan line SLk, the source electrode of the second transistor TR2 may be connected to the gate electrode of the first transistor TR1, and the drain electrode of the second transistor TR2 may be connected to the j-th data line DLj.

The capacitor Cst may be connected between the gate electrode and the source electrode of the first transistor TR1. Accordingly, the capacitor Cst may keep the data voltage applied to the gate electrode of the first transistor TR1 constant.

The light emitting element EL may emit light according to the driving current of the first transistor TR1. The light emitting element EL may be an organic light emitting diode including a first electrode, an organic light emitting layer and a second electrode. The first electrode of the light emitting element EL may be connected to the source electrode of the first transistor TR1, and the second electrode of the light emitting element EL may be connected to the second voltage line VSS to which the second power supply voltage, which may be lower than the first power supply voltage, is applied.

Figure 4:
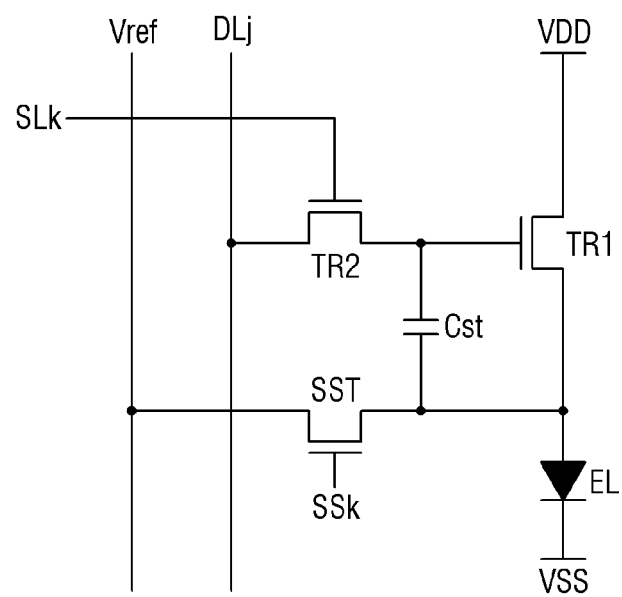
FIG. 4 illustrates a schematic diagram of an equivalent circuit of a pixel of FIG. 2 according to an embodiment.

FIG. 4 illustrates a schematic diagram of an equivalent circuit of a pixel of FIG. 2 according to an embodiment.

Referring to FIG. 4, the pixel PX may include a first transistor TR1, a second transistor TR2, a sensing transistor SST, a light emitting element EL and a capacitor Cst. FIG. 4 illustrates that each pixel PX may have a 3T1C (3Transistor-1Capacitor) configuration having one first transistor TR1, one second transistor TR2, a sensing transistor SST and one capacitor Cst.

The circuit diagram of FIG. 4 may further include a compensation circuit including the sensing transistor SST and the reference line Vref. The compensation circuit may be a circuit that may be added in each pixel PX to compensate a threshold voltage of the first transistor TR1.

The sensing transistor SST may be connected between the source electrode of the first transistor TR1 and the first electrode of the light emitting element EL. The gate electrode of the sensing transistor SST may be connected to a k-th sensing signal line SSk, the drain electrode of the sensing transistor SST may be connected to the reference line Vref, and the source electrode of the sensing transistor SST may be connected to one end of the capacitor Cst. The sensing transistor SST may be turned on by a sensing signal of the k-th sensing signal line SSk to supply a reference voltage, which may be transmitted through the reference line Vref, to the source electrode of the first transistor TR1. The sensing transistor may operate to sense the voltage or current of the source electrode of the first transistor TR1.

The reference line Vref may be connected to the scan driver 30. The scan driver 30 may sense the source electrode of the first transistor TR1 of each pixel PX in real time, during a non-display period of an image, or during a period of an N frame (where N is an integer of 1 or more), and may generate the sensing result. The second transistor TR2, which may be a switching transistor, and the sensing transistor SST, which may be a sensing transistor, may be turned on at the same time. A sensing operation of the sensing transistor SST, via the reference line Vref, and a data output operation for outputting a data signal may be separated from each other according to a time division method of the scan driver 30.

A compensation target according to the sensing result may be a digital data signal, an analog data signal, gamma, or the like. Further, a compensation circuit for generating a compensation signal based on the sensing result may be implemented as a circuit in the scan driver 30, a circuit in the timing controller 21, or a separate circuit.

In FIGS. 3 and 4, the pixels PX having the 2T1C configuration and the 3T1C configuration may be examples of pixels For example, a pixel may include a larger number of transistors or capacitors.

Figure 5:
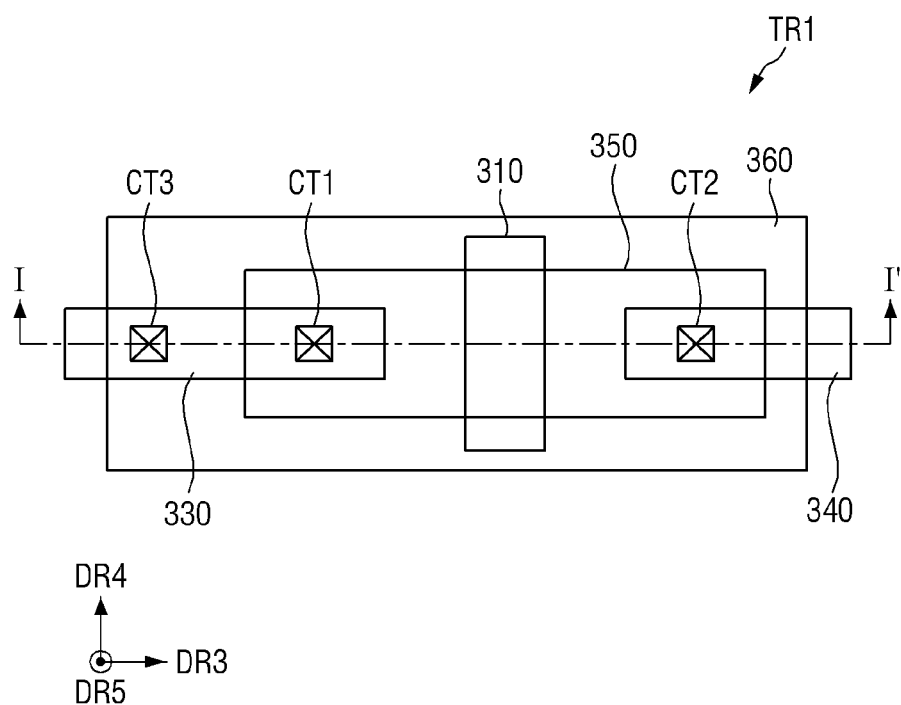
FIG. 5 illustrates a plan view of a first transistor according to an embodiment.
Figure 6:
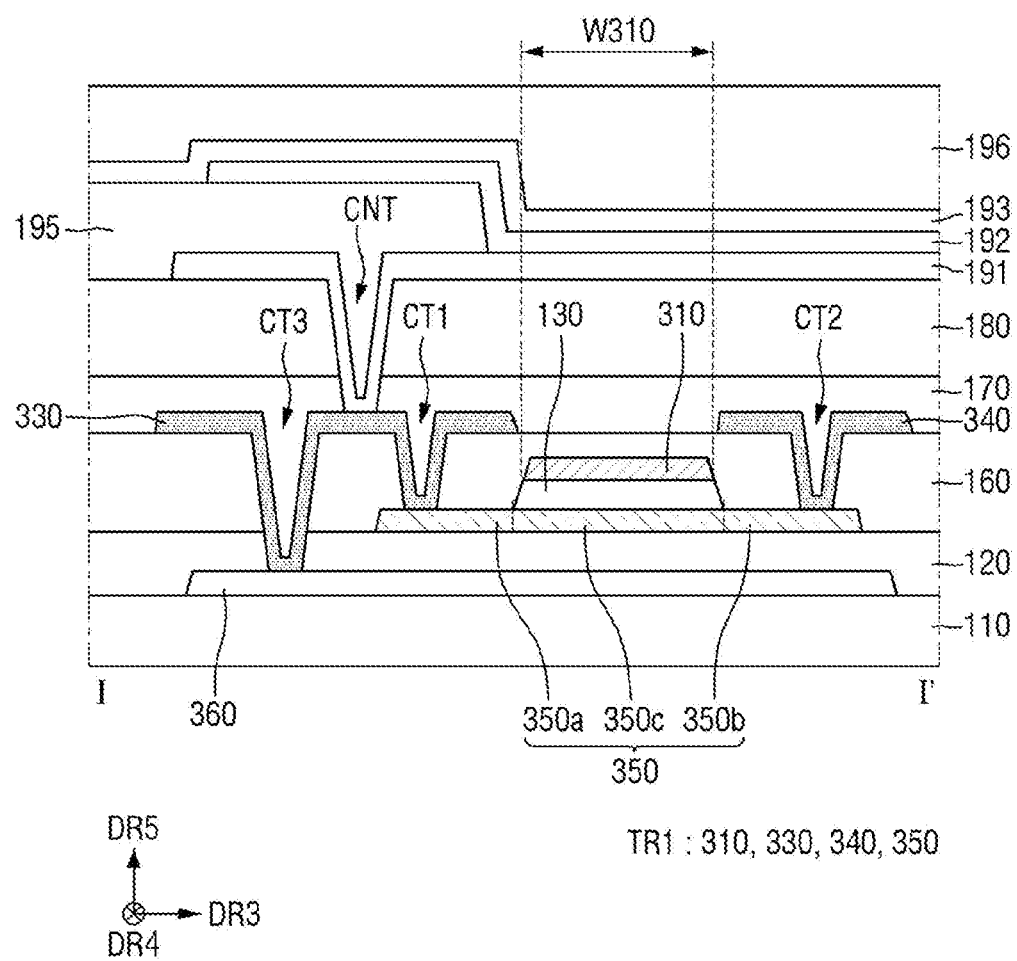
FIG. 6 illustrates a schematic cross-sectional view taken along line I-I' of FIG. 5.
Figure 7:
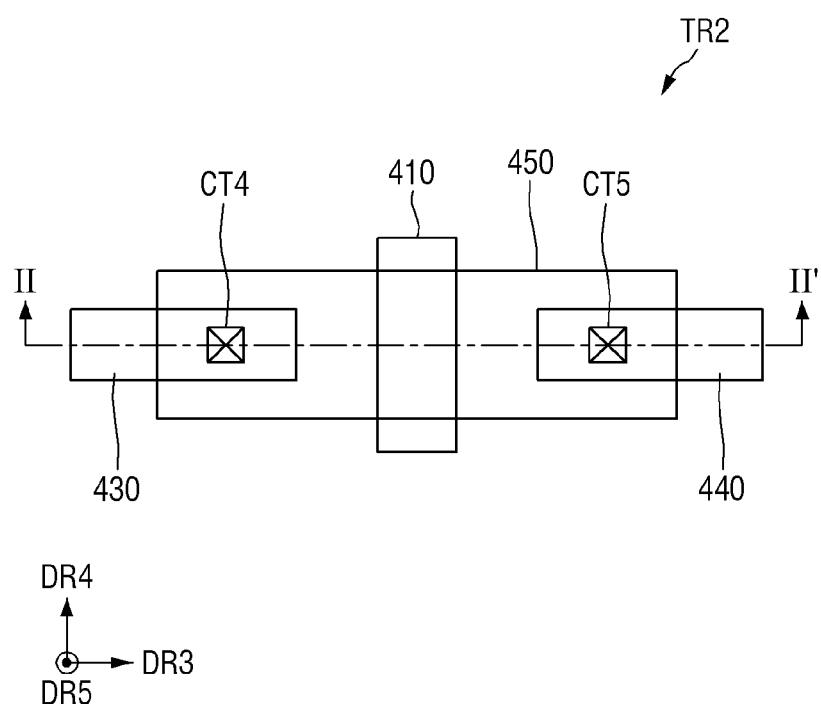
FIG. 7 illustrates a plan view of a second transistor according to an embodiment.
Figure 8:
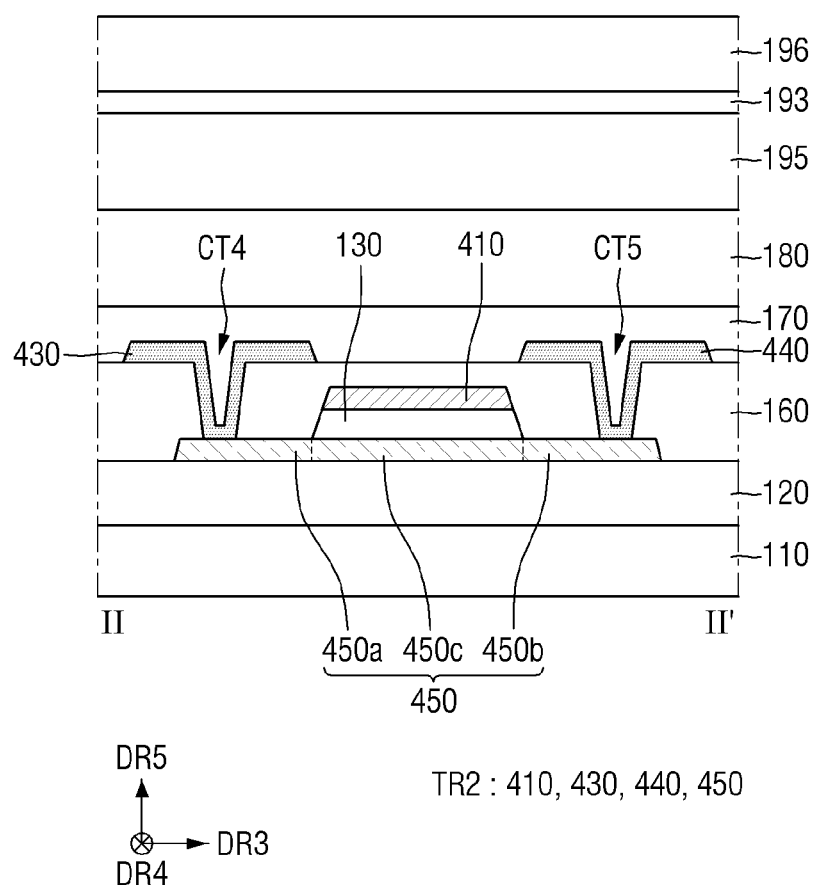
FIG. 8 illustrates a schematic cross-sectional view taken along line II-II' of FIG. 7.

FIG. 5 illustrates a plan view of a first transistor according to an embodiment. FIG. 6 illustrates a schematic cross-sectional view taken along line I-I' of FIG. 5. FIG. 7 illustrates a plan view of a second transistor according to an embodiment. FIG. 8 illustrates a schematic cross-sectional view taken along line II-II' of FIG. 7.

FIGS. 5 to 8 illustrate that the first transistor TR1, which is a driving transistor, and the second transistor TR2, which is a switching transistor, are configured to be coplanar. The coplanar configuration may include a top-gate format in which a gate electrode may be formed above an active layer. However, the disclosure may not be limited thereto. For example, the first transistor TR1 and the second transistor TR2 of each pixel PX may have a bottom-gate format in which a gate electrode may be formed below an active layer.

Referring to FIGS. 5 to 8, each pixel PX of the display panel 10 ma includes a first substrate 110, a buffer layer 120, a first gate insulating layer 130, a first transistor TR1, a second transistor TR2, a first interlayer insulating layer 160, a first passivation layer 170, a first planarization layer 180, a first electrode 191, an organic light emitting layer 192, a second electrode 193, a pixel defining layer 195 and an encapsulation layer 196.

The first transistor TR1 of each pixel PX may include a first gate electrode 310, a first active layer 350, a first source electrode 330, a first drain electrode 340 and a first light shielding layer 360. The second transistor TR2 of the pixel PX may include a second gate electrode 410, a second active layer 450, a second source electrode 430 and a second drain electrode 440.

The first substrate 110 may provide a region on which the first transistor TR1 and the second transistor TR2 may be formed. The first substrate 110 may be made of plastic or glass.

The first light shielding layer 360 may be disposed on the first substrate 110. The first light shielding layer 360 may block light from entering the first active layer 350 from the first substrate 110. The first light shielding layer 360 may prevent a leakage current that may flow in the first active layer 350 in a case that light from the first substrate 110 may be incident on the first active layer 350. The length of the first light shielding layer 360 in a third direction DR3 and the length of the first light shielding layer 360 in a fourth direction DR4 may be longer than the length of the first active layer 350 in the third direction DR3 and the length of the first active layer 350 in the fourth direction DR4. The first light shielding layer 360 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The buffer layer 120 may be disposed on the first light shielding layer 360. The buffer layer 120 may protect the first transistor TR1 and the second transistor TR2 of the pixel PX from moisture that may penetrate through the first substrate 110. The buffer layer 120 may include alternately stacked inorganic layers. For example, the buffer layer 120 may be formed of multiple layers in which one or more inorganic layers of a silicon oxide (SiOx) layer, a silicon nitride (SiNx) layer, and a silicon oxynitride (SiON) layer are alternately stacked.

The first active layer 350 and the second active layer 350 may be disposed on the buffer layer 120. The first active layer 350 and the second active layer 450 may include first conductor regions 350a and 450a, second conductor regions 350b and 450b, and channel regions 350c and 450c, respectively. The channel regions 350c and 450c may be disposed between the first conductor regions 350a and 450a and the second conductor regions 350b and 450b.

The first active layer 350 and the second active layer 450 may be an oxide semiconductor containing indium (In). In other words, the first active layer 350 and the second active layer 450 may each be defined by the oxide semiconductor containing indium (In). The first active layer 350 and the second active layer 450 may include indium-tin oxide (ITO) or indium-tin-gallium oxide (ITGO).

The active layers 350 and 450 of the first transistor TR1 and the second transistor TR2 may be made as an oxide semiconductor containing a specific amount of indium (In), thereby improving the operational characteristics, electrical characteristics, and the like of the transistor. In a case, such as in a transistor, the oxide semiconductor may contain a relatively low amount of indium (In). With such a transistor, a narrow range of driving voltages may result. Accordingly, the transistor having such an oxide semiconductor active layer may be prevented from being used as a driving transistor for transmitting driving current to the light emitting element EL of a pixel PX. Furthermore, as the number of pixels included in the display panel 10 of the display device 1 increases, the channel region of the active layer for a driving transistor may become narrow. As a result, a sufficient range of driving voltages may not be able to be obtained.

In contrast, the display device 1 herein may include an oxide semiconductor active layer in which the first transistor TR1, which is a driving transistor, contains a specific amount of indium (In). Thus, even if the active layer may a channel region which is short in length, the active layer may have driving voltages that may be in a predetermined range. Accordingly, the transistor having an oxide semiconductor may be utilized as a driving transistor of the display device 1.

The first transistor TR1 may include the first active layer 350 having an oxide semiconductor containing indium (In), and the first active layer 350 may have a total amount of indium (In) which may be greater than or equal to about 70 at %, e.g., about 75 at %.

Defects may be formed in the active layer of a driving transistor during a process of forming a gate insulating layer. For example, a region trapping electrons may be formed in a band gap of a front channel region of the active layer. In a case that the active layer of the driving transistor may be an oxide semiconductor having a high amount of indium (In), a subthreshold swing (SS) of the driving transistor may increase to a large value, and the slope of the driving current (drain-source current Ids) curve according to the driving voltage Vgs may decrease. For example, the driving transistor may have a wider range of driving voltages in the same driving current range.

Figure 9:
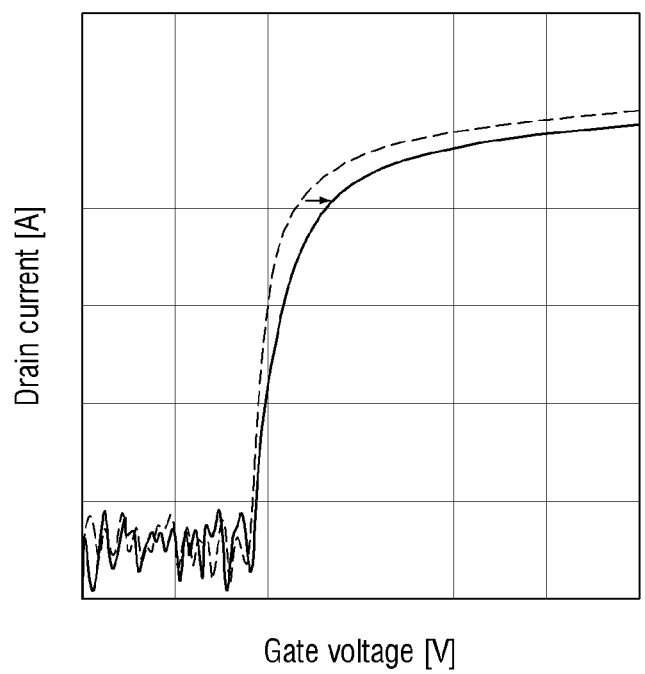
FIG. 9 illustrates a graph showing a driving current according to a gate voltage of a first transistor according to an embodiment.

FIG. 9 illustrates a graph showing a driving current according to a gate voltage of a first transistor according to an embodiment, in comparison to a transistor that is unlike the first transistor with respect to an amount of indium (In) included in an oxide semiconductor as an active layer. In FIG. 9, the dotted line represents a driving transistor including an oxide semiconductor having an indium (In) amount of 52 at %. The solid line represents a driving transistor including an oxide semiconductor having an indium (In) amount of about 75 at % as an active layer according to one or more of the embodiments herein.

Referring to FIG. 9, in a case that the active layer of the driving transistor may include a relatively high amount of indium (In), the slope of the curve in the graph of the driving current (A) according to the gate voltage (V) may be reduced. According to the transistor as shown by the dotted line of FIG. 9, the swing value below the threshold voltage may be observed to be about 0.25 and the driving range of the gate voltage (V) may be observed to be about 1.27 V. Further, due to the rising slope as shown by the dotted line, an incremental increase in the range of the driving voltage does not exceed an incremental increase in the range of the driving current. However, according to the transistor according to one more embodiments herein as represented by the solid line of FIG. 9, the swing value below the threshold voltage may be observed to be about 0.56 and the driving range of the gate voltage (V) may be observed to be about 2.89 V. The driving transistor having an oxide semiconductor containing a high amount of indium (In) as an active layer, e.g., greater than or equal to about 70 at %, may have a wider range of the gate voltage (V) in the same range of the driving current (A). In other words, the range of the driving voltage for controlling the driving current (A) for driving the light emitting element EL of the pixel PX may be widened, i.e., increased, in comparison to such a range of the driving voltage as may be applicable to a transistor. Further, with the driving transistor as described herein, although the driving current of each of the pixels may decrease as the number of pixels PX per unit area of the display panel 10 may increase in a high resolution display device, it may be possible to prevent or reduce a decrease in the driving voltage range of the driving transistor.

The first active layer 350 of the first transistor TR1 may further include tin (Sn). The sum amount of the indium (In) and tin (Sn) may be greater than or equal to about 95 at % relative to the amount of cations included in the oxide semiconductor. The amount of tin (Sn) contained in the oxide semiconductor may range from about 5% to about 20% relative to the amount of indium (In). Thus, the first transistor TR1 may include a high amount of indium (In), and may further include tin (Sn) in addition to the indium (In), and may thereby ensure excellent performance as a driving transistor.

Referring again to FIGS. 5 to 8, the first gate insulating layer 130 may be disposed on the first active layer 350 and the second active layer 450. The first gate insulating layer 130 may include an inorganic material, such as silicon oxide (SiOx), silicon nitride (SiNx), or a stacked structure thereof.

The first gate electrode 310 and the second gate electrode 410 may be disposed on the first gate insulating layer 130. The first gate electrode 310 may overlap or face the first active layer 350 with the first gate insulating layer 130 interposed therebetween. The second gate electrode 410 may overlap or face the second active layer 450 with the first gate insulating layer 130 interposed therebetween. For example, the first gate electrode 310 may overlap or face the channel region 350c of the first active layer 350, and the second gate electrode 410 may overlap or face the channel region 450c of the second active layer 450. The first gate electrode 310 and the second gate electrode 410 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

The overlapping or facing region between the first active layer 350 and the first gate electrode 310 may have a length measured in a given direction, which ranges from about 2 μm to about 10 μm. As described above, the first active layer 350 of the first transistor TR1 containing a high amount of indium (In) may have good operational characteristics. Accordingly, even if the number of pixels PX per unit area of the display panel 10 may increase such that the length of the channel region of the active layer may be shortened as a result, a wide range of driving voltages may still be obtained. In this respect, a length W310, which is measured in the given direction (e.g., a third direction DR3 that is perpendicular to a fifth direction DR5), of the region where the first active layer 350 and the first gate electrode 310 overlap or face each other may range from about 2 μm to about 10 μm, from about 2.5 μm to about 4.5 μm, or from about 3 μm to about 4 μm. However, other ranges within the range of about 2 μm to about 10 μm may also be applicable.

Although FIGS. 6 and 8 illustrate that the first gate insulating layer 130 may be disposed between the first gate electrode 310 and the first active layer 350 and between the second gate electrode 410 and the second active layer 450, the embodiments herein may not be limited thereto. For example, the first gate insulating layer 130 may be formed on the upper and side surfaces of each of the first active layer 350 and the second active layer 450.

The first interlayer insulating layer 160 may be disposed on the first gate electrode 310 and the second gate electrode 410. The first interlayer insulating layer 160 may include an inorganic material, such as silicon oxide (SiOx), silicon nitride (SiNx), or a stacked structure thereof.

The first interlayer insulating layer 160 may include a first contact hole CT1 passing through the first interlayer insulating layer 160 to expose a portion of the upper surface of the first active layer 350 and a second contact hole CT2 passing through the first interlayer insulating layer 160 to expose another portion of the upper surface of the first active layer 350. For example, the first contact hole CT1 may be formed to expose the first conductor region 350a of the first active layer 350, and the second contact hole CT2 may be formed to expose the second conductor region 350b of the first active layer 350. Further, a third contact hole CT3 may be formed in the first interlayer insulating layer 160 and the buffer layer 120 to pass through the first interlayer insulating layer 160 and the buffer layer 120 to expose the first light shielding layer 360.

The first interlayer insulating layer 160 may include a fourth contact hole CT4 passing through the first interlayer insulating layer 160 to expose a portion of the upper surface of the second active layer 450 and a fifth contact hole CT5 passing through the first interlayer insulating layer 160 to expose another portion of the upper surface of the second active layer 450. That is, the fourth contact hole CT4 may be formed to expose the first conductor region 450a of the second active layer 450, and the fifth contact hole CT5 may be formed to expose the second conductor region 450b of the second active layer 450.

The first source electrode 330 and the first drain electrode 340 of the first transistor TR1, and the second source electrode 430 and the second drain electrode 440 of the second transistor TR2 may be disposed on the first interlayer insulating layer 160.

The first source electrode 330 may be in contact with the first conductor region 350a formed on one side of the first active layer 350 through the first contact hole CT1. The first drain electrode 340 may be in contact with the second conductor region 350b formed on the other side of the first active layer 350 through the second contact hole CT2.

The second source electrode 430 may be in contact with the first conductor region 450a formed on one side of the second active layer 450 through the fourth contact hole CT4. The second drain electrode 440 may be in contact with the second conductor region 450b formed on the other side of the second active layer 450 through the fifth contact hole CT5.

The first passivation layer 170 may be disposed on the source electrodes 330 and 430 and the drain electrodes 340 and 440 of the first transistor TR1 and the second transistor TR2. The first passivation layer 170 may include an inorganic material, such as silicon oxide (SiOx), silicon nitride (SiNx), or a stacked structure thereof.

The first planarization layer 180 may be disposed on the first passivation layer 170. The first planarization layer 180 may planarize a step that may occur due to formation of the thin film transistor such as the first transistor TR1 and the second transistor TR2. The first planarization layer 180 may include an organic layer such as acryl resin, epoxy resin, phenolic resin, polyamide resin, polyimide resin and the like.

The light emitting element EL including the first electrode 191, the organic light emitting layer 192 and the second electrode 193 and the pixel defining layer 195, may be formed on the first planarization layer 180.

The first electrode 191 may be formed on the first planarization layer 180. The first electrode 191 may be connected to the source electrode 330 of the first transistor TR1 through a contact hole CNT passing through the first passivation layer 170 and the first planarization layer 180.

The pixel defining layer 195 may be formed to cover the edge of the first electrode 191 on the first planarization layer 180 in order to partition the pixels. For example, the pixel defining layer 195 may define pixels. Each of the pixels may represent a region where the first electrode 191, the organic light emitting layer 192 and the second electrode 193 may be stacked sequentially, and holes from the first electrode 191 and electrons from the second electrode 193 may be coupled to each other in the organic light emitting layer 192 to emit light.

The organic light emitting layer 192 may be disposed on the first electrode 191 and the pixel defining layer 195. The organic light emitting layer 192 may include a hole transporting layer, a light emitting layer, and an electron transporting layer. The organic light emitting layer 192 may be formed in a tandem configuration of two or more stacks, in which case a charge generating layer may be formed between the stacks.

The second electrode 193 may be formed on the organic light emitting layer 192.

The second electrode 193 may be a common layer that may be formed commonly among pixels.

The light emitting elements EL may be formed as a top emission type so as to emit light in an upward direction. The first electrode 191 may be formed of a metal material, having high reflectivity, such as a stacked structure (Ti/Al/Ti) of aluminum (Al) and titanium (Ti), a stacked structure (ITO/Al/ITO) of Al and ITO, an APC alloy, a stacked structure (ITO/APC/ITO) of an APC alloy and ITO, or the like. The APC alloy is an alloy of silver (Ag), palladium (Pd) and copper (Cu). The second electrode 193 may include a transparent conductive material (TCO) such as ITO or IZO that can transmit light or a semi-transmissive conductive material such as magnesium (Mg), silver (Ag), or an alloy of magnesium (Mg) and silver (Ag). In a case that the second electrode 193 may include a semi-transmissive conductive material, light emission efficiency may be improved due to a micro-cavity effect.

The encapsulation layer 196 may be formed on the second electrode 193 to prevent permeation of oxygen or moisture. The encapsulation layer 196 may include at least one inorganic layer. The inorganic layer may be formed of silicon nitride, aluminum nitride, zirconium nitride, titanium nitride, hafnium nitride, tantalum nitride, silicon oxide, aluminum oxide, or titanium oxide. Further, the encapsulation layer 196 may include at least one organic layer to prevent particles from penetrating the encapsulation layer 196 and entering the organic light emitting layer 192 and the second electrode 193. The organic layer may be formed of epoxy, acrylate or urethane acrylate.

A method of manufacturing the display device 1 including the first transistor TR1 and second transistor TR2 will be described below.

Figure 10:
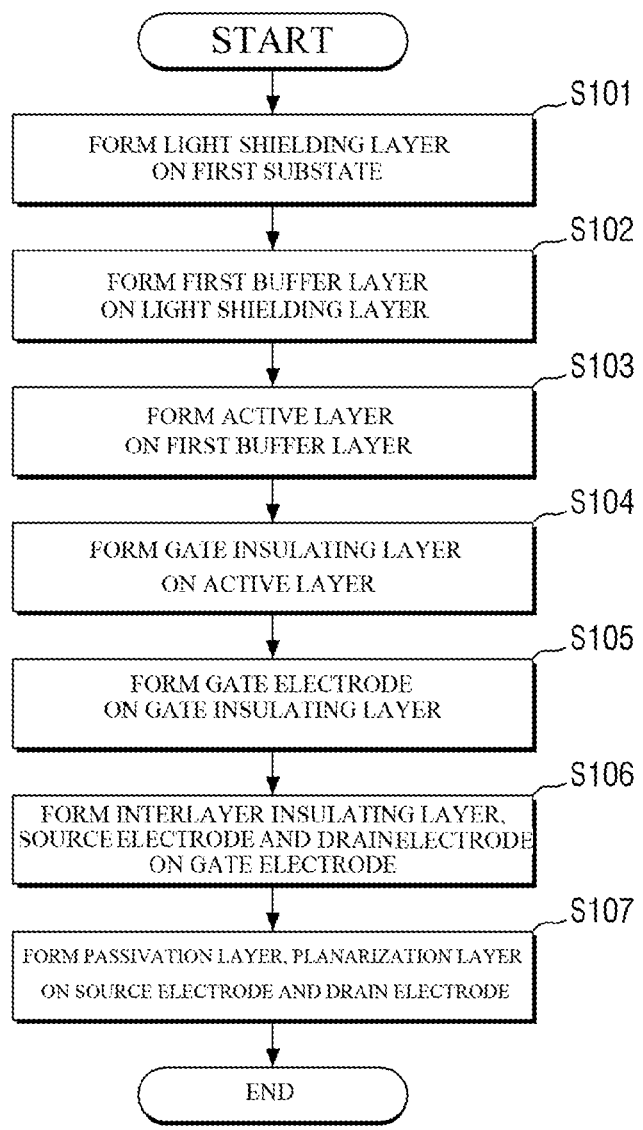
FIG. 10 illustrates a flowchart showing a method of manufacturing a display device according to an embodiment.

FIG. 10 illustrates a flowchart showing a method of manufacturing a display device according to an embodiment. FIGS. 11 to 15 illustrate schematic cross-sectional views taken along lines I-I' and II-II' of FIGS. 6 and 8 of a method of manufacturing a display device according to an embodiment.

Figure 11:
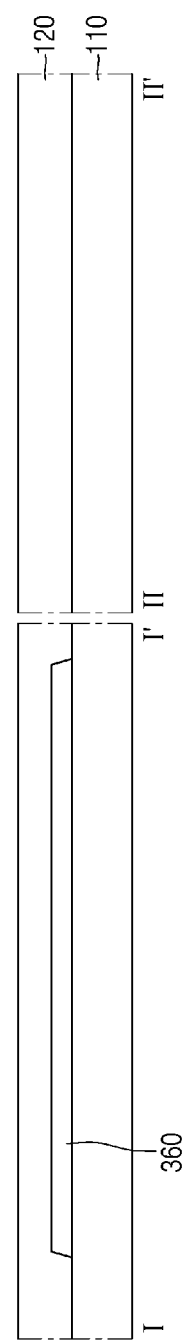
FIGS. 11 to 15 illustrates schematic cross-sectional views of a method of manufacturing a display device according to an embodiment.

Referring to FIGS. 10 to 15, As shown in FIG. 11, the first light shielding layer 360 may be formed on the first substrate 110 (step S101 of FIG. 10), and the buffer layer 120 may be formed on the first light shielding layer 360 (step S102 of FIG. 10). The first light shielding layer 360 may be formed by patterning a light shielding metal layer, which may be formed on the first substrate 110 by a sputtering method, or by an etching process using a photoresist pattern. The buffer layer 120 may be formed by chemical vapor deposition. However, the disclosure may not be limited thereto.

Though the first light shielding layer 360 has been described above, it will be understood that another light shielding layer, which is formed in a same manner as the light shielding layer 360, may be disposed on the first substrate 110.

Figure 12:
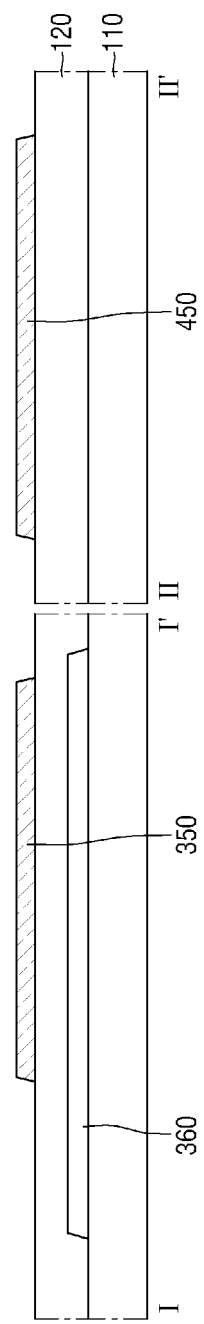

As shown in FIG. 12, the first active layer 350 and the second active layer 450 may be formed on the buffer layer 120 (step S103 of FIG. 10). The first active layer 350 and the second active layer 450 may be formed by a patterning process using a photoresist once one layer may be formed by a sputtering method. However, the disclosure may not be limited thereto and, in some cases, the first active layer 350 and the second active layer 450 may be formed by atomic layer deposition.

Figure 13:
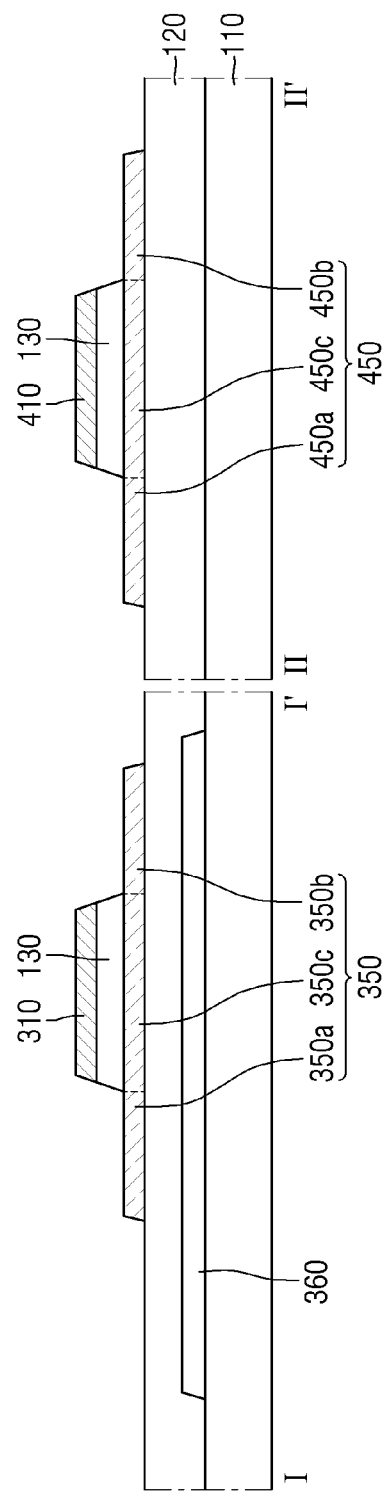

As shown in FIG. 13, the first gate insulating layer 130 may be formed on the first active layer 350 and the second active layer 450 (step S104 of FIG. 10), and the first gate electrode 310 and the second gate electrode 410 may be formed thereon (step S105 of FIG. 10).

The first gate insulating layer 130 may be formed by chemical vapor deposition. The first gate electrode 310 and the second gate electrode 410 may be formed by performing a patterning process using a photoresist on a gate metal layer formed on the first gate insulating layer 130 once the first gate insulating layer is formed by a sputtering method.

Figure 14:
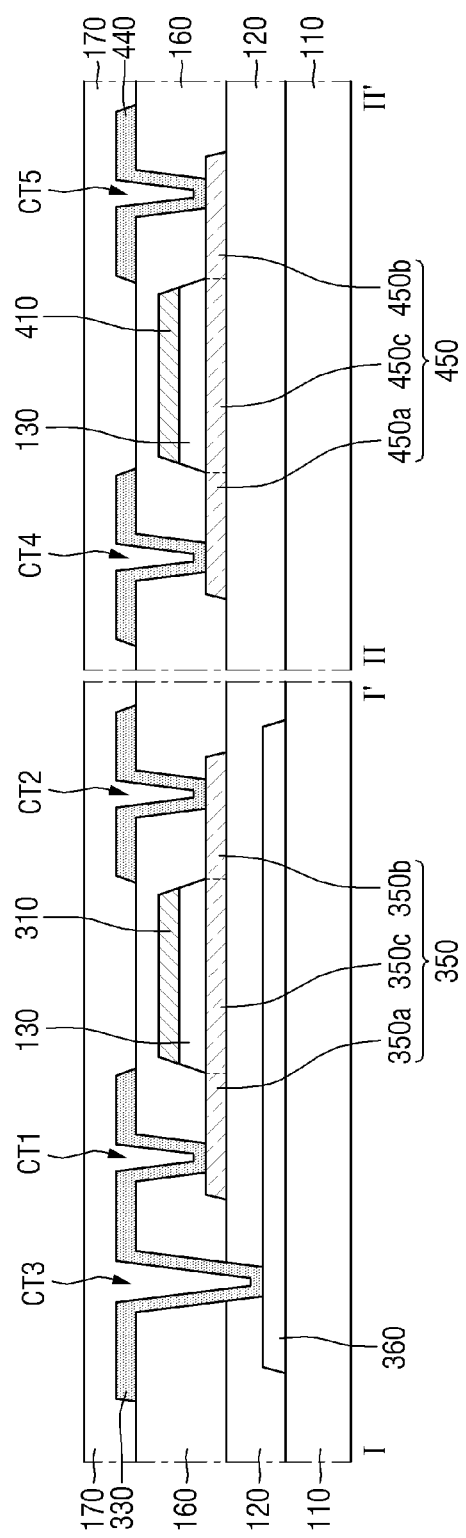

As illustrated in FIG. 14, the first interlayer insulating layer 160, the first and second source electrodes 330 and 430, and the first and second drain electrodes 340 and 440 may be formed to be included in the first transistor TR1 and the second transistor TR2. The first and second source electrodes 330 and 430 and the first and second drain electrodes 340 and 440 may be formed by patterning a metal layer, which is formed on the first interlayer insulating layer 160 by a sputtering method, or by an etching process using a photoresist pattern.

Figure 15:
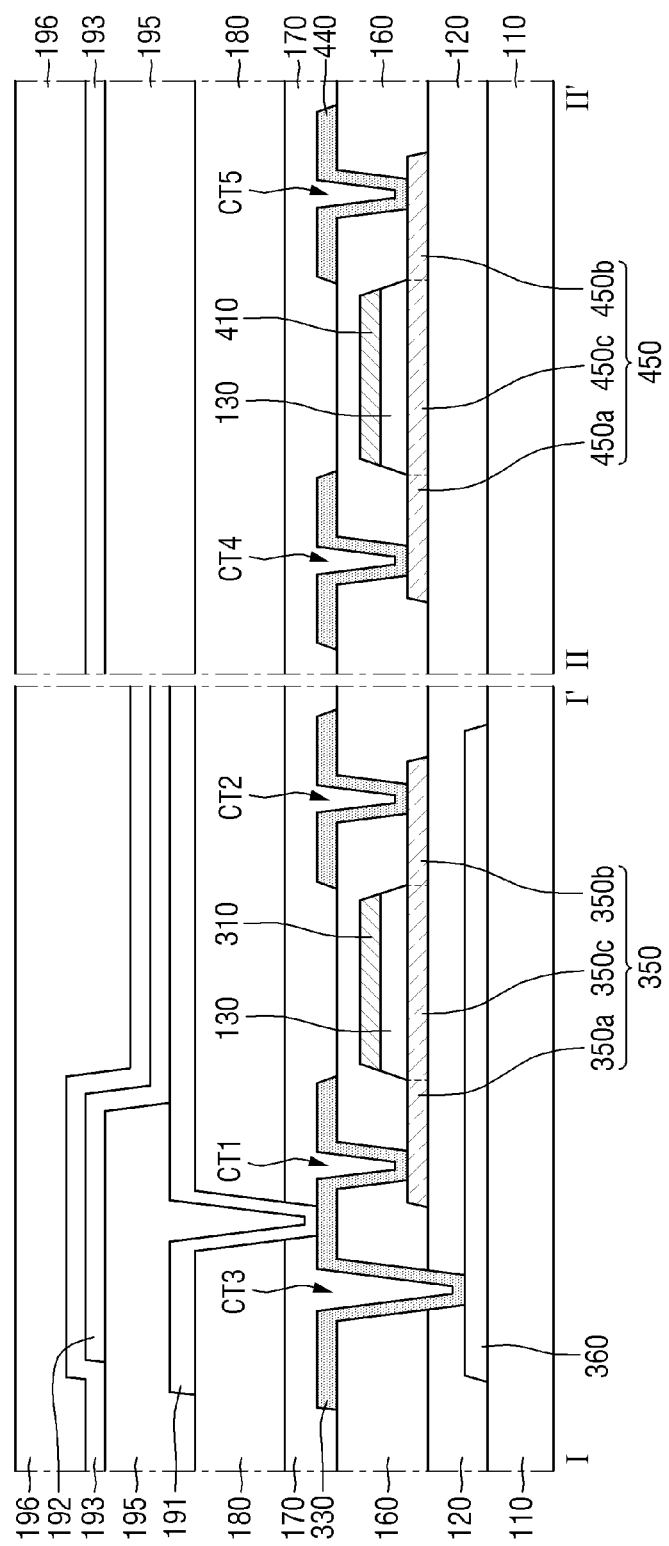

As shown in FIG. 15, the first passivation layer 170, the first planarization layer 180, the first electrode 191, the organic light emitting layer 192, the pixel defining layer 195, the second electrode 193 and the encapsulation layer 196 may be formed.

Hereinafter, description of the first transistor TR1 and the second transistor TR2 according to another embodiment follows below.

The first active layer 350 of the first transistor TR1 may further include a region where the concentration of oxygen atoms O may be higher than that of other regions.

Figure 16:
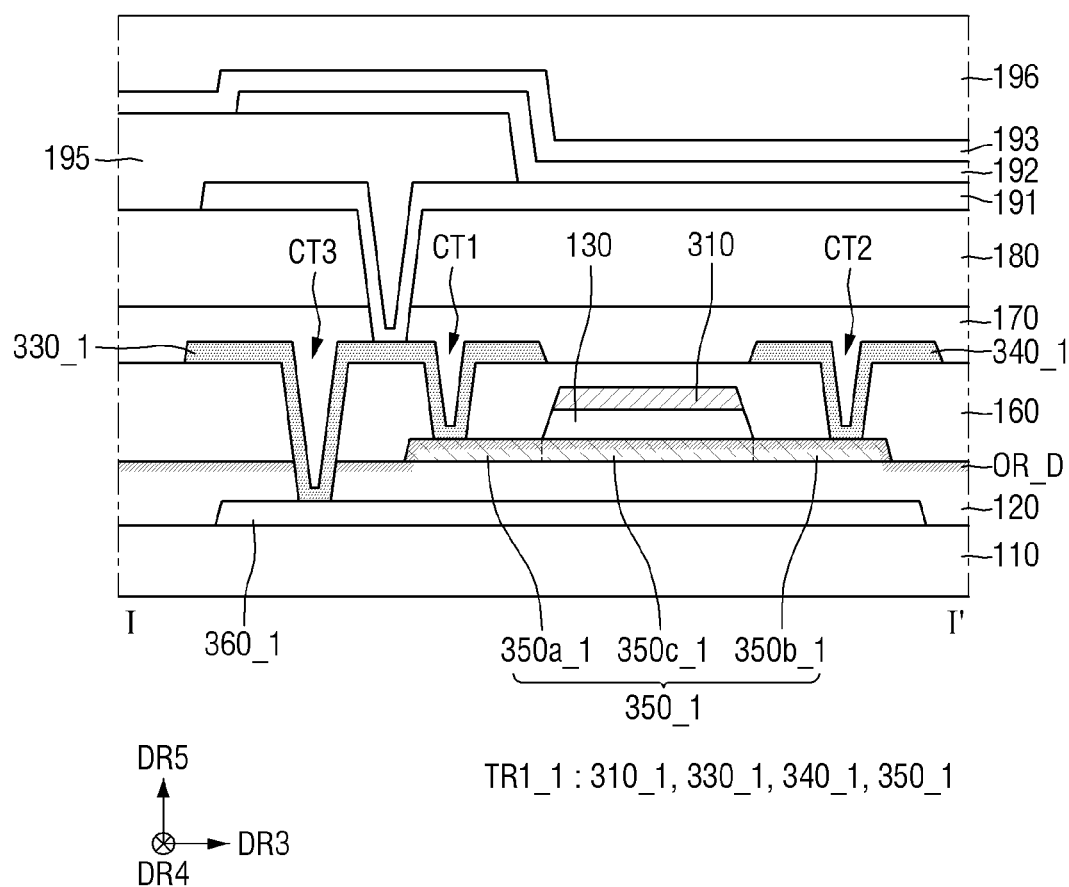
FIG. 16 illustrates a schematic cross-sectional view of a first transistor according to another embodiment.
Figure 17:
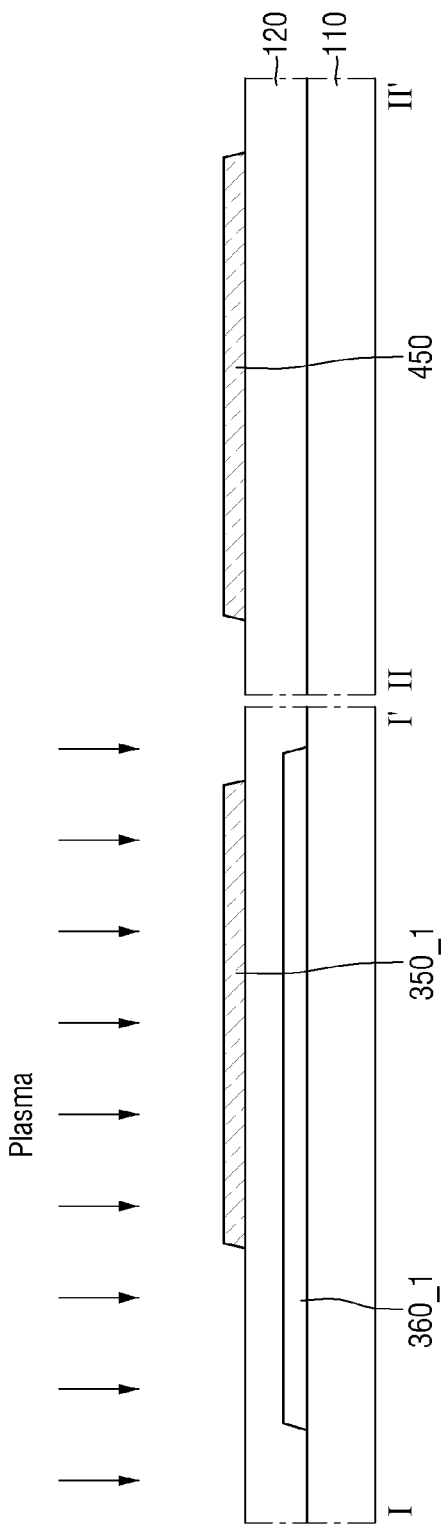
FIG. 17 illustrates a schematic cross-sectional view partially illustrating a method of manufacturing the first transistor of FIG. 16.
Figure 18:
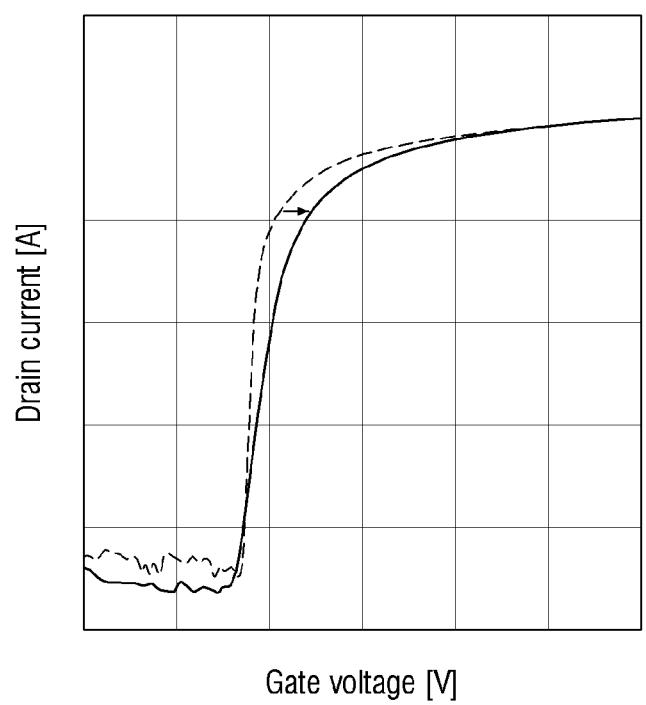
FIG. 18 illustrates a graph of a driving current according to a gate voltage of the first transistor of FIG. 16.

FIG. 16 illustrates a schematic cross-sectional view illustrating a first transistor according to another embodiment. FIG. 17 is a schematic cross-sectional view partially illustrating a method of manufacturing the first transistor of FIG. 16. FIG. 18 is a graph illustrating a driving current according to a gate voltage of the first transistor of FIG. 16.

Referring to FIGS. 16 to 18, a first transistor TR1_1 may further include a first region and a second region OL_1 having a higher concentration of oxygen atoms than that of the first region. The first transistor TR1_1 of FIG. 16 differs from the embodiment of FIG. 6 in that it further includes the second region OL_1 having a higher concentration of oxygen atoms.

The first transistor TR1_1 of FIG. 16 may include the second region OL_1 (as indicated by the provided hatching) formed on at least an upper surface and at least one side surface of a first active layer 350_1. The second region OL_1 may be also be partially formed in a region adjacent to the upper surface of the first active layer 350_1, e.g., a corner of the first active layer 350_1 between the upper surface the at least one side surface. The second region OL_1 may be formed above a bottom of the buffer layer 120, on which the first active layer 350_1 may be disposed i.e., at a top of the buffer layer 120.

The second region OL_1 may have a higher concentration of oxygen atoms O than that of the first region of the first active layer 350_1. The first region of the first active layer 350_1 may be a region of the first active layer 350_1 that is opposite the upper surface, i.e., a lower surface of the first active layer 350_1. Accordingly, the oxygen atom concentration of the upper surface of the first active layer 350_1 may be larger than the oxygen atom concentration of the lower surface thereof. The second region OL_1 may be formed by irradiating a plasma containing oxygen atoms on the first active layer 350_1 once the first active layer 350_1 may be formed.

As illustrated in FIG. 17, in a case that a plasma containing oxygen atoms, e.g., an $N_2O$ plasma, may be irradiated onto the first active layer 350_1 formed on the buffer layer 120, the second region OL_1, which may have a higher concentration of oxygen atoms than that of other regions of the first active layer 350_1 may be formed on the upper surface of the first active layer 350_1. Although the plasma may be irradiated (as indicated by the downward arrows) only on the first active layer 350_1, the plasma may also be irradiated on the second active layer 450 of the second transistor TR2. As the plasma is irradiated, the second region OL_1 where the concentration of oxygen atoms is higher than that of other regions may be formed in a region adjacent to the exposed upper surface and both side surfaces of the first active layer 350_1. Accordingly, the oxygen atom concentration of the upper surface of the first active layer 350_1 may be larger than the oxygen atom concentration of the lower surface thereof.

In a case that the first active layer 350_1 may include the second region OL_1 having a higher concentration of oxygen atoms than that of other regions, the performance of the first transistor TR1_1 may be further maximized. As shown in FIG. 18, the first active layer 350_1 of the first transistor TR1_1 may include the second region OL_1 containing a relatively high amount of indium (In) and having a high concentration of oxygen atoms as described above. Accordingly, the swing value below the threshold voltage may be increased.

In FIG. 18, the dotted line represents a driving transistor including an active layer formed by irradiating $N_2O$ plasma on an oxide semiconductor having an indium (In) amount of 52 at %. The solid line may represent a driving transistor that may include an active layer formed by irradiating $N_2O$ plasma on an oxide semiconductor having an indium (In) amount of about 75 at %. In the curve represented by the dotted line of FIG. 18, the swing value below the threshold voltage may be observed to be about 0.26 and the driving range of the gate voltage (V) may be observed to be about 1.28 V. However, in the graph represented by the solid line of FIG. 18 (i.e., driving transistor including an oxide semiconductor active layer including the second region OL_1 as shown in FIG. 16), the swing value below the threshold voltage may be observed to be about 0.58 and the driving range of the gate voltage (V) may be observed to be about 3.24 V. As compared to FIG. 9, it may be seen that in a case where the $N_2O$ plasma may be irradiated to an oxide semiconductor containing about 75 at % of indium (In) to form a region having a high concentration of oxygen atoms, the driving range of the gate voltage V may be further increased. Therefore, the first active layer 350_1 may include the second region OL_1 which is a region having a high concentration of oxygen atoms via irradiation of $N_O$ plasma, and the first transistor TR1_1 according to the embodiment may have a wider driving range of the gate voltage (V) in the same range of the driving current (A).

Further, and similar to the first transistor TR1, the second transistor TR2 may include a light shielding layer.

Figure 19:
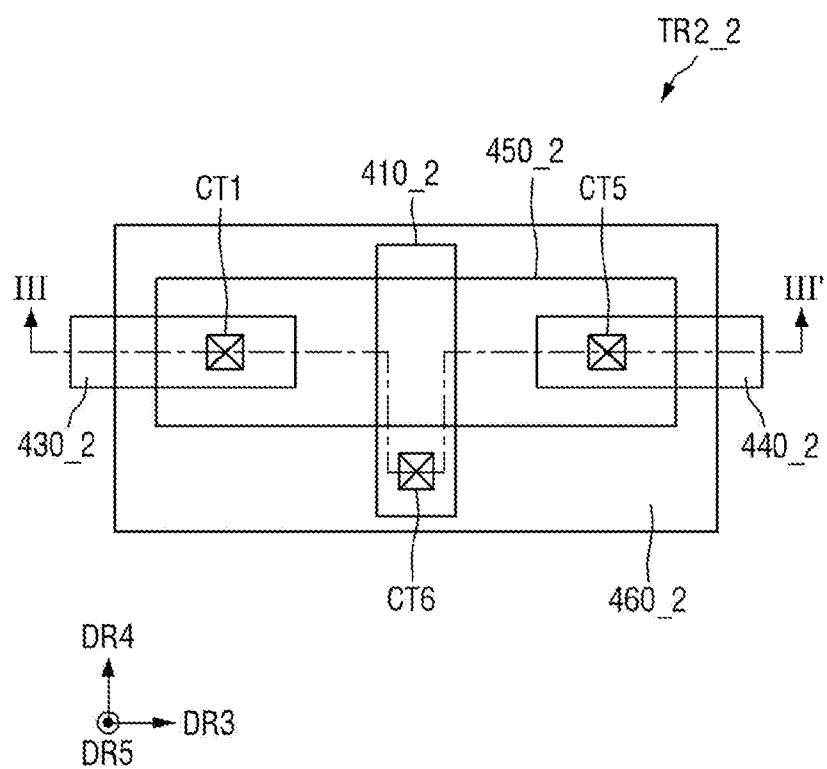
FIG. 19 illustrates a plan view of a second transistor according to another embodiment.
Figure 20:
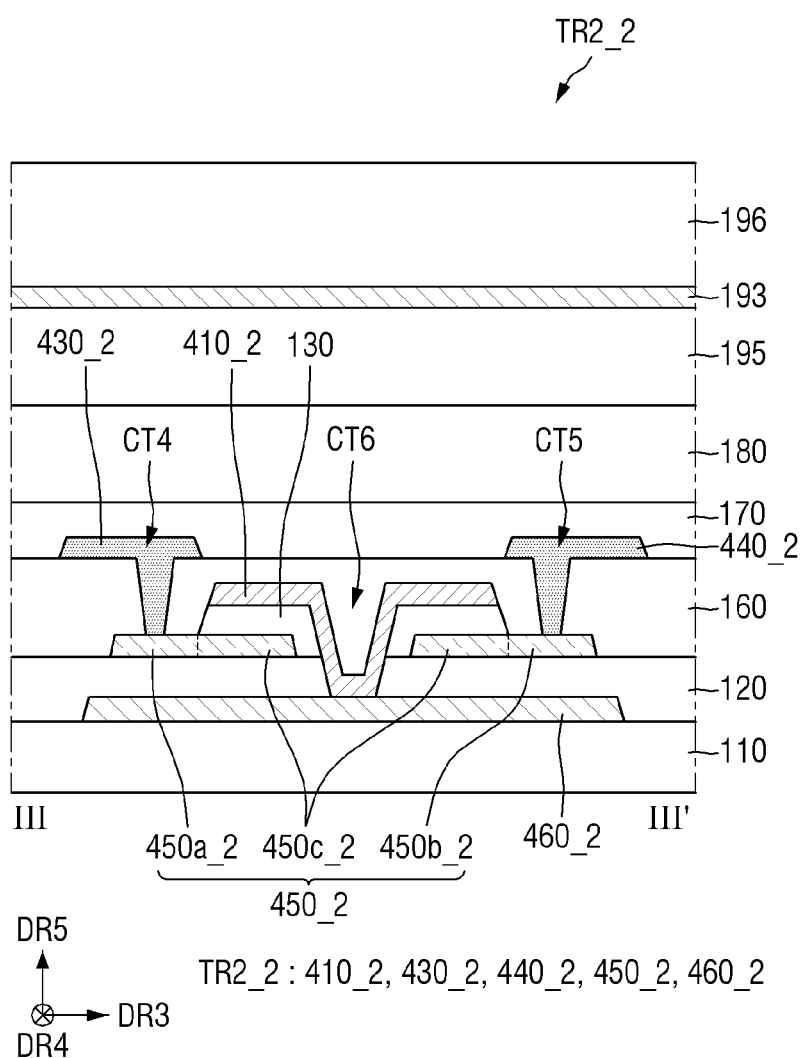
FIG. 20 illustrates a schematic cross-sectional view taken along line III-III' of FIG. 19.

FIG. 19 illustrates a plan view of a second transistor according to another embodiment. FIG. 20 illustrates a schematic cross-sectional view taken along line III-III' of FIG. 19.

Referring to FIGS. 19 and 20, a second transistor TR2_2 according to the embodiment may further include a second light shielding layer 460_2. A second gate electrode 410_2 may be connected to the second light shielding layer 460_2. The second transistor TR2_2 of FIGS. 19 and 20 may be different from the second transistor TR2 of FIGS. 7 and 8 in that the second gate electrode 410_2 may be connected to the second light shielding layer 460_2.

The second transistor TR2_2 of FIGS. 19 and 20 may include the second gate electrode 410_2, a second active layer 450_2, a second source electrode 430_2, a second drain electrode 440_2 and the second light shielding layer 460_2.

The second light shielding layer 460_2 may be disposed on the first substrate 110. The second light shielding layer 460_2 may prevent light from the outside from being incident on the second active layer 450_2 through the first substrate 110. The length of the second light shielding layer 460_2 in the third direction DR3 and the length of the second light shielding layer 460_2 in the fourth direction DR4 may be longer than the length of the second active layer 450_2 in the third direction DR3 and the length of the second active layer 450_2 in the fourth direction DR4. The second light shielding layer 460_2 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. The buffer layer 120 may be formed on the second light shielding layer 460_2.

The second gate electrode 410_2 may be in contact with the second light shielding layer 460_2 through a sixth contact hole CT6. The sixth contact hole CT6 may be formed to pass through the first gate insulating layer 130 and the buffer layer 120 to expose the second light shielding layer 460_2. The second gate electrode 410_2 and the second light shielding layer 460_2 disposed below the second active layer 450_2 may have the same voltage. For example, the second gate electrode 410_2 may serve as an upper gate electrode, and the second light shielding layer 460_2 may serve as a lower gate electrode. Therefore, since the second transistor TR2_2, which may be a switching transistor, may be driven in a double gate manner, a leakage current may be prevented or reduced from flowing into a channel region 450c_2 of the second active layer 450_2 of the second transistor TR2_2 in a case that the second transistor TR2_2 may be off.

Although not shown, the scan driver 30 may include stages, and the stages may sequentially output scan signals S to the scan line SL of each pixel PX. The stages may include a pull-up transistor, a pull-down transistor, and a node controller. The pull-up transistor and the pull-down transistor may be formed in substantially the same manner as the second transistor TR2. Although not shown, the display device 1 may further include a data voltage divider circuit, and the data voltage divider circuit may include divider transistors. The divider transistors may also be formed in substantially the same manner as the second transistor TR2. The pull-up transistor, the pull-down transistor and the divider transistors may also include an electrode, an active layer, a source electrode and a drain electrode, each of which may be formed substantially the same as the second transistor TR2 described above.

Figure 21:
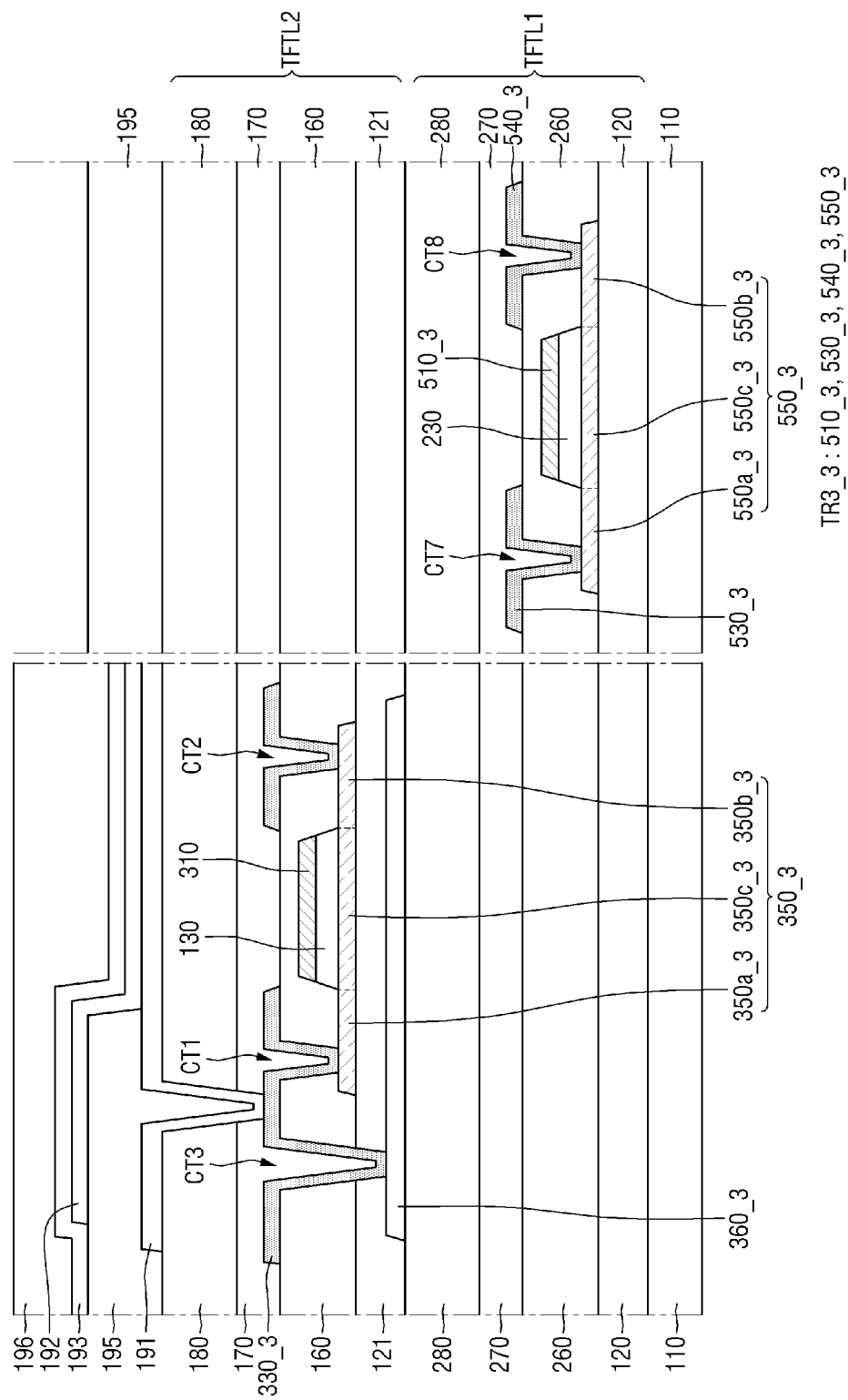
FIG. 21 illustrates a schematic cross-sectional view of a part of a display panel according to an embodiment.

FIG. 21 illustrates a schematic cross-sectional view of a part of a display panel according to an embodiment.

Referring to FIG. 21, the display device 1 according to an embodiment may include transistor layers TFTL1 and TFTL2. The transistor layers TFTL1 and TFTL2 may include a first transistor layer TFTL1 and a second transistor layer TFTL2, which have different transistors, respectively. A third transistor TR3_3, e.g., a third active layer 550_3 of the pull-up transistor of the scan driver 30 described above, may include polysilicon. A first transistor TR1_3 and a second transistor TR2_3, which may be a driving transistor and a switching transistor of each pixel PX, respectively, may be located above the third transistor TR3_3. Although only the first transistor TR1_3 is illustrated, the second transistor TR2_3 may also be disposed on the same layer as the first transistor TR1_3. The first transistor TR1_3 may include the active region 350_3, including the conductor regions 350a_3 and 350b_3 and channel region 350c_3, along with the light shielding layer 360_3. The embodiment of FIG. 21 may differ from other embodiments herein in that multiple transistors included in the display device 1 may be disposed in different transistor layers TFTL1 and TFTL2.

As illustrated in FIG. 21, the first transistor layer TFTL1 may include the third transistor TR3_3, and the third transistor TR3_3 may include a third gate electrode 510_3, a third active layer 550_3, and a third source electrode 530_3 and a third drain electrode 540_3.

The third active layer 550_3 may be disposed on the buffer layer 120. The third active layer 550_3 may include polycrystalline silicon, and may include a first doped region 550a_3, a second doped region 550b_3 and a channel region 550c_3. The channel region 550c_3 may be made of polycrystalline silicon which may not be doped with impurities, and the first doped region 550a_3 and the second doped region 550b_3 may be made of polycrystalline silicon doped with impurities. However, the disclosure may not be limited thereto, and the third active layer 550_3 may also be formed of an oxide semiconductor in the same manner as the first active layer 350_3.

The second gate insulating layer 230 may be disposed on the third active layer 550_3. The second gate insulating layer 230 may be formed of, for example, silicon oxide (SiOx), silicon nitride (SiNx), or a stacked configuration thereof.

The third gate electrode 510_3 may be disposed on the second gate insulating layer 230. The third gate electrode 510_3 may overlap or face the third active layer 550_3 with the second gate insulating layer 230 interposed therebetween. The third gate electrode 510_3 may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof.

Though the second gate insulating layer 230 may disposed between the third active layer 550_3 and the third gate electrode 510_3, the second gate insulating layer 230 may also be formed on the upper and side surfaces of the third active layer 550_3.

The second interlayer insulating layer 260 may be disposed on the third gate electrode 510_3. The second interlayer insulating layer 260 may be formed of an inorganic material, such as silicon oxide (SiOx), silicon nitride (SiNx), or a stacked configuration thereof.

The second interlayer insulating layer 260 may include a seventh contact hole CT7 passing through the second interlayer insulating layer 260 to expose a portion of the upper surface of the third active layer 550_3 and an eighth contact hole CT8 passing through the second interlayer insulating layer 260 to expose another portion of the upper surface of the third active layer 550_3. For example, the seventh contact hole CT7 may be formed to expose the first doped region 550a_3 of the third active layer 550_3, and the eighth contact hole CT8 may be formed to expose the second doped region 550b_3 of the third active layer 550_3.

The third source electrode 530_3 and the third drain electrode 540_3 of the third transistor TR3_3 may be disposed on the second interlayer insulating layer 260.

The third source electrode 530_3 may be in contact with the first doped region 550a_3 formed on one side of the third active layer 550_3 through the seventh contact hole CT7. The third drain electrode 540_3 may be in contact with the second doped region 550b_3 formed on the other side of the third active layer 550_3 through the eighth contact hole CT8.

A second passivation layer 270 may be formed on the third source electrode 530_3 and the third drain electrode 540_3. The second passivation layer 270 may be formed of an inorganic layer, for example, a silicon oxide (SiOx) layer, a silicon nitride (SiNx) layer, or a multilayer configuration thereof.

A second planarization layer 280 may be disposed on the second passivation layer 270. The second planarization layer 280 may planarize a step due to formation of the thin film transistor such as the third transistor TR3. The second planarization layer 280 may be formed of an organic layer such as acryl resin, epoxy resin, phenolic resin, polyamide resin, polyimide resin and the like.

An insulating layer 121 may be disposed on the second planarization layer 280. Further, the first interlayer insulating layer 160, the first passivation layer 170 and the first planarization layer 180 described above with reference to FIGS. 5 to 8 may be formed on the insulating layer 121. For example, in the embodiment shown in FIG. 21, the first transistor layer TFTL1, including the third transistor TR3, which may be a pull-up transistor, a pull-down transistor and divider transistors included in the scan driver 30 may be disposed on the first substrate 110. The second transistor layer TFTL2 including the first transistor TR1 and the second transistor TR2, which are a driving transistor and a switching transistor of each of the pixels PX, respectively, may be disposed on the first transistor layer TFTL1. The light emitting elements EL including the first electrode 191, the organic light emitting layer 192 and the second electrode 193 may be formed on the second transistor layer TFTL2.

However, the embodiments may not be limited thereto. In the embodiment of FIG. 21, the third transistor TR3_3 may have a different configuration. For example, the third transistor TR3_3 may further include a light shielding layer. Furthermore, the first transistor TR1 and the second transistor TR2 may be disposed in the different transistor layers TFTL1 and TFTL2, respectively.

Although the embodiments of the disclosure have been described, it may be understood that the disclosure may not be limited to these embodiments and that various changes and modifications may be made by one ordinary skilled in the art within the spirit and scope of the disclosure as hereinafter claimed. Therefore, the disclosed subject matter may not be limited to any single embodiment described herein, and the scope of the disclosure may be determined according to the attached claims.

What is claimed is:
1. A display device, comprising:
  pixels connected to scan lines and data lines intersecting the scan lines, wherein
  each of the pixels includes a light emitting element and a first transistor configured to control a driving current supplied to the light emitting element according to a data voltage applied from a respective data line of the data lines, and
  the first transistor of each pixel includes a first active layer including an oxide semiconductor containing indium (In) and tin (Sn) with an amount of indium (In) being greater than or equal to about 70 at % such that a range of the driving current of the first transistor is widened.
2. The display device of claim 1, wherein the oxide semiconductor includes indium-tin oxide (ITO) or indium-tin-gallium oxide (ITGO).

3. The display device of claim 1, wherein a sum of an amount of indium (In) and an amount of tin (Sn) in the oxide semiconductor is greater than or equal to about 95 at %.

4. The display device of claim 3, wherein the amount of tin (Sn) in the oxide semiconductor is in the range of about 5% to about 20%.

5. The display device of claim 1, wherein the first active layer includes a first region, and a second region having a higher concentration of oxygen atoms than that of the first region.

6. The display device of claim 5, wherein the second region is located on an upper surface of the first active layer and at least one side surface of the first active layer.

7. The display device of claim 1, wherein the first active layer includes a first conductor region, a second conductor region and a channel region disposed between the first conductor region and the second conductor region.

8. The display device of claim 7, wherein the first transistor further includes:
   a first light shielding layer disposed below the first active layer;
   a first gate electrode disposed on the first active layer;
   a first source electrode in contact with the first conductor region through a first contact hole passing through a first insulating layer disposed on the first gate electrode; and
   a first drain electrode in contact with the second conductor region through a second contact hole passing through the first insulating layer.

9. The display device of claim 8, wherein the first gate electrode overlaps the first active layer in an overlapping amount of about 2 µm to about 10 µm.

10. The display device of claim 8, wherein the first source electrode is in contact with the first light shielding layer through a third contact hole passing through the first insulating layer and a buffer layer disposed between the first active layer and the first light shielding layer.

11. The display device of claim 1, wherein a respective pixel of the pixels includes a second transistor configured to apply the data voltage of the respective data line of the data lines to the first transistor according to a scan signal applied to a respective scan line of the scan lines that is connected with the second transistor, and the second transistor includes a second active layer including an oxide semiconductor including indium (In).

12. The display device of claim 11, wherein the second transistor further includes:
   a second light shielding layer disposed below the second active layer; and
   a second gate electrode disposed on the second active layer.

13. The display device of claim 12, wherein the second gate electrode is in contact with the second light shielding layer through a sixth contact hole passing through a first gate insulating layer disposed between the second active layer and the second gate electrode and a buffer layer disposed between the second active layer and the second light shielding layer.

14. The display device of claim 1, further comprising:
   a scan driver configured to output a scan signal to a respective scan line of the scan lines, wherein
   the scan driver includes a third transistor including a third active layer.

15. The display device of claim 14, wherein the first active layer of the first transistor is disposed above the third active layer of the third transistor.

16. A display device, comprising:
   pixels connected to scan lines and data lines intersecting the scan lines, wherein
   each of the pixels includes a light emitting element, a driving transistor configured to control a driving current supplied to the light emitting element according to a data voltage applied from a respective data line of the data lines, and a switching transistor configured to apply the data voltage of the respective data line to the driving transistor according to a scan signal applied to a respective scan line of the scan lines,
   the driving transistor and the switching transistor of each pixel include an active layer including an oxide semiconductor containing indium (In) and tin (Sn) with an amount of the indium (In) being greater than or equal to about 70 at % such that a range of the driving current of the first transistor is widened.

17. The display device of claim 16, wherein the oxide semiconductor includes indium-tin oxide (ITO) or indium-tin-gallium oxide (ITGO).

18. The display device of claim 16, wherein a sum of an amount of indium (In) and an amount of tin (Sn) in the oxide semiconductor is greater than or equal to about 95 at %.

19. The display device of claim 16, wherein an oxygen atom concentration of an upper surface of the active layer of the driving transistor is higher than an oxygen atom concentration of a lower surface thereof.

20. The display device of claim 16, wherein the driving transistor further includes a gate electrode disposed on the active layer, and an overlapping region of the gate electrode and the active layer has a length in a range of about 2 µm to about 10 µm.

* * * * *

UNITED STATES PATENT AND TRADEMARK OFFICE
CERTIFICATE OF CORRECTION

PATENT NO. : 11,335,273 B2
APPLICATION NO. : 16/849575
DATED : May 17, 2022
INVENTOR(S) : Hye Lim Choi et al.

It is certified that error appears in the above-identified patent and that said Letters Patent is hereby corrected as shown below:

On the Title Page

Item (72) the seventh inventor's name:
"Geun Chui PARK" should be listed as "Geun Chul PARK".

Signed and Sealed this
Twenty-eighth Day of June, 2022

Katherine Kelly Vidal
*Director of the United States Patent and Trademark Office*